(12) United States Patent
Doering et al.

(10) Patent No.: US 11,584,992 B2
(45) Date of Patent: *Feb. 21, 2023

(54) GAS DISTRIBUTION ASSEMBLY FOR IMPROVED PUMP-PURGE AND PRECURSOR DELIVERY

(71) Applicant: Applied Materials, Inc., Santa Clara, CA (US)

(72) Inventors: Kenneth Brian Doering, San Jose, CA (US); Mario D. Silvetti, Fountain Hills, AZ (US); Kevin Griffin, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/512,263

(22) Filed: Oct. 27, 2021

(65) Prior Publication Data

US 2022/0049354 A1 Feb. 17, 2022

Related U.S. Application Data

(63) Continuation of application No. 16/444,543, filed on Jun. 18, 2019, now Pat. No. 11,174,553.
(Continued)

(51) Int. Cl.
*C23C 16/40* (2006.01)
*C23C 16/455* (2006.01)
*C23C 16/458* (2006.01)

(52) U.S. Cl.
CPC .... *C23C 16/45563* (2013.01); *C23C 16/4584* (2013.01); *C23C 16/45544* (2013.01)

(58) Field of Classification Search
CPC .......... C23C 16/45563; C23C 16/4584; C23C 16/45544; C23C 16/4401; C23C 16/45565; C23C 16/45574; C23C 16/45551
(Continued)

(56) References Cited

U.S. PATENT DOCUMENTS

2003/0037729 A1* 2/2003 DeDontney ....... C23C 16/45519
156/345.33
2003/0113451 A1* 6/2003 Mayer ................... C23C 16/045
427/255.28
(Continued)

FOREIGN PATENT DOCUMENTS

KR 100439949 B1 7/2004
KR 20110024558 A 3/2011
(Continued)

OTHER PUBLICATIONS

PCT International Search Report and Written Opinion in PCT/US2019/037652 dated Oct. 18, 2019, 11 pages.

*Primary Examiner* — Rudy Zervigon
(74) *Attorney, Agent, or Firm* — Servilla Whitney LLC

(57) ABSTRACT

Gas injector inserts having a wedge-shaped housing, at least one first slot and at least one second slot are described. The housing has a first opening in the back face that is in fluid communication with the first slot in the front face and a second opening in the back face that is in fluid communication with the second slot in the front face. Each of the first slot and the second slot has an elongate axis that extends from the inner peripheral end to the outer peripheral end of the housing. The gas injector insert is configured to provide a flow of gas through the first slots at supersonic velocity. Gas distribution assemblies and processing chambers including the gas injector inserts are described.

14 Claims, 10 Drawing Sheets

Related U.S. Application Data

(60) Provisional application No. 62/686,398, filed on Jun. 18, 2018.

(58) Field of Classification Search
USPC .............. 118/715, 728; 156/345.29, 345.33, 156/345.34
See application file for complete search history.

(56) References Cited

U.S. PATENT DOCUMENTS

| | | | |
|---|---|---|---|
| 2008/0081114 A1* | 4/2008 | Johanson | .......... C23C 16/45565 |
| | | | 427/273 |
| 2008/0166880 A1* | 7/2008 | Levy | ................ C23C 16/45551 |
| | | | 438/758 |
| 2013/0210238 A1 | 8/2013 | Yudovsky | |
| 2015/0007774 A1* | 1/2015 | Iwasaki | ................... C23C 16/50 |
| | | | 118/723 R |
| 2016/0099144 A1 | 4/2016 | Saly | |
| 2016/0276197 A1 | 9/2016 | Kim et al. | |
| 2016/0322218 A1* | 11/2016 | Fukiage | .............. H01L 21/0228 |
| 2017/0191159 A1 | 7/2017 | Polyak et al. | |

FOREIGN PATENT DOCUMENTS

| | | |
|---|---|---|
| KR | 101540718 B1 | 7/2015 |
| KR | 20180014205 A | 2/2018 |

* cited by examiner

GAS DISTRIBUTION ASSEMBLY FOR IMPROVED PUMP-PURGE AND PRECURSOR DELIVERY

CROSS-REFERENCE TO RELATED APPLICATIONS

This application is a continuation of U.S. patent application Ser. No. 16/444,543, filed Jun. 18, 2019, which claims priority to U.S. Provisional Application No. 62/686,398, filed Jun. 18, 2018, the entire disclosure of which is hereby incorporated by reference herein.

TECHNICAL FIELD

Embodiments of the disclosure generally relate to an apparatus for semiconductor wafer processing. More particularly, embodiments of the disclosure relate to gas injector inserts and gas distribution assemblies with a gas injector insert that provides improved pump-purge operation and precursor delivery.

BACKGROUND

Atomic Layer Deposition (ALD) and Plasma-Enhanced ALD (PEALD) are deposition techniques that offer control of film thickness and conformality in high-aspect ratio structures. Due to continuously decreasing device dimensions in the semiconductor industry, there is increasing interest and applications that use ALD/PEALD. In some cases, only PEALD can meet specifications for desired film thickness and conformality.

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

In large spatial ALD processing chambers, reactive gases can be dragged between process regions resulting in gas phase mixing of the reactive gases. Additionally, reaction byproducts can be dragged through the gas curtains separating process regions.

Therefore, there is a need in the art for apparatus to improve separation of process gases in a spatial ALD processing chamber.

SUMMARY

One or more embodiments of the disclosure are directed to gas injector inserts comprising a wedge-shaped housing having a back face and front face, an inner peripheral end and an outer peripheral end defining a length and elongate axis, and a first side and a second side defining a width, the width increasing from the inner peripheral end to the outer peripheral end. A first opening is in the back face of the housing. The first opening is in fluid communication with at least one first slot in the front face of the housing. The first slot has an elongate axis extending from a first end near the inner peripheral end to a second end near the outer peripheral end. A second opening is in the back face of the housing. The second opening is in fluid communication with at least one second slot in the front face of the housing. The second slot has an elongate axis extending from a first end near the inner peripheral end to a second end near the outer peripheral end.

Additional embodiments of the disclosure are directed to gas injector inserts comprising a wedge-shaped housing having a back face and front face, an inner peripheral end and an outer peripheral end defining a length and elongate axis, and a first side and a second side defining a width. The width increases from the inner peripheral end to the outer peripheral end. A first opening is in the back face of the housing. The first opening is in fluid communication with four first slots in the front face of the housing. The first slots have elongate axes extending from a first end near the inner peripheral end to a second end near the outer peripheral end. A second opening is in the back face of the housing. The second opening is in fluid communication with three second slots in the front face of the housing. The second slots have elongate axes extending from a first end near the inner peripheral end to a second end near the outer peripheral end. Each of the first slots is spaced from adjacent first slots by a second slot and a gas flowing through the first slot exits the housing at supersonic velocity.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
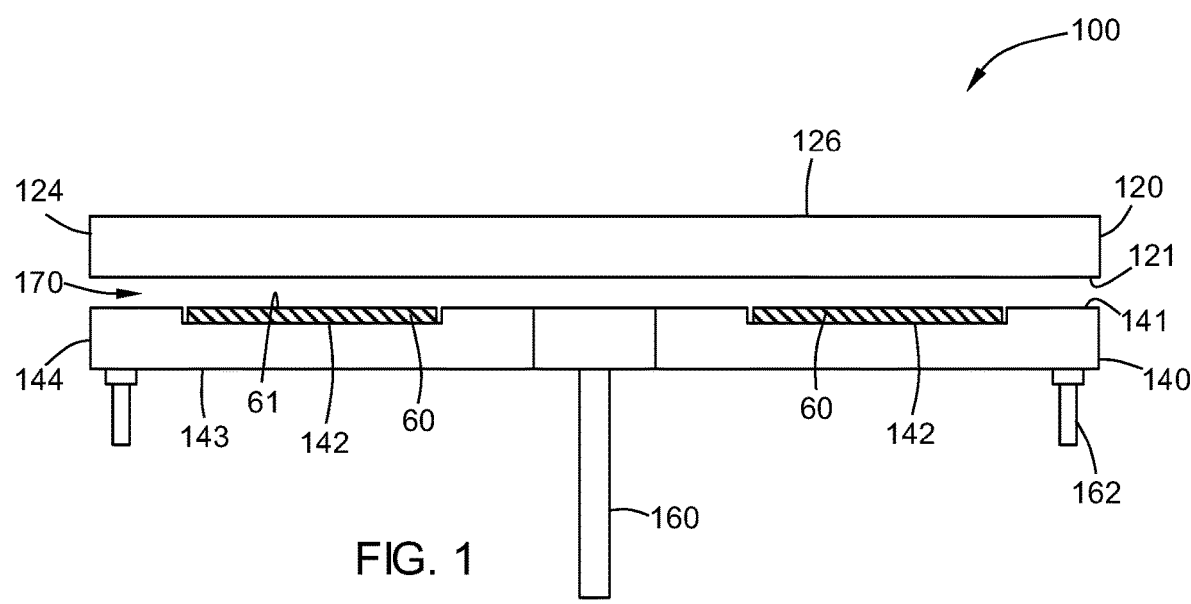
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front face of the gas distribution assembly is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
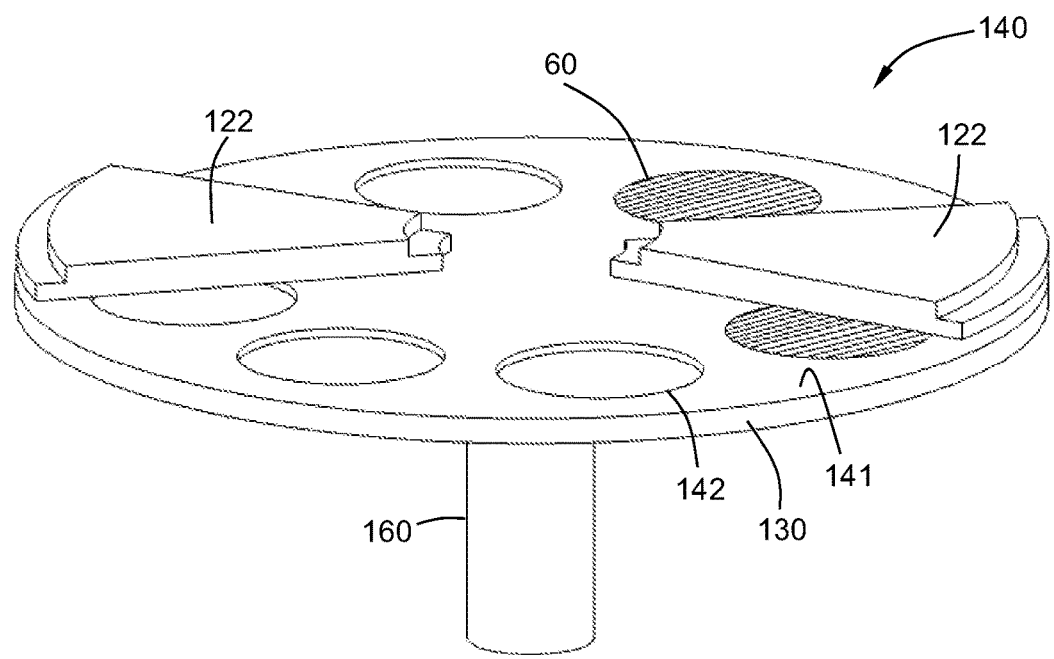
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the wafer is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
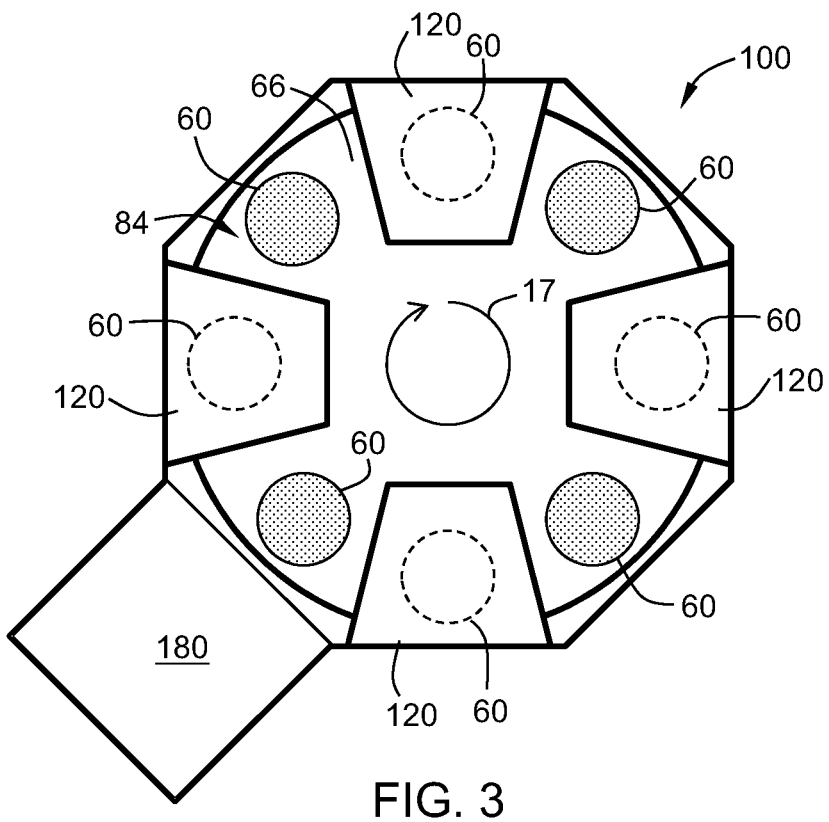
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
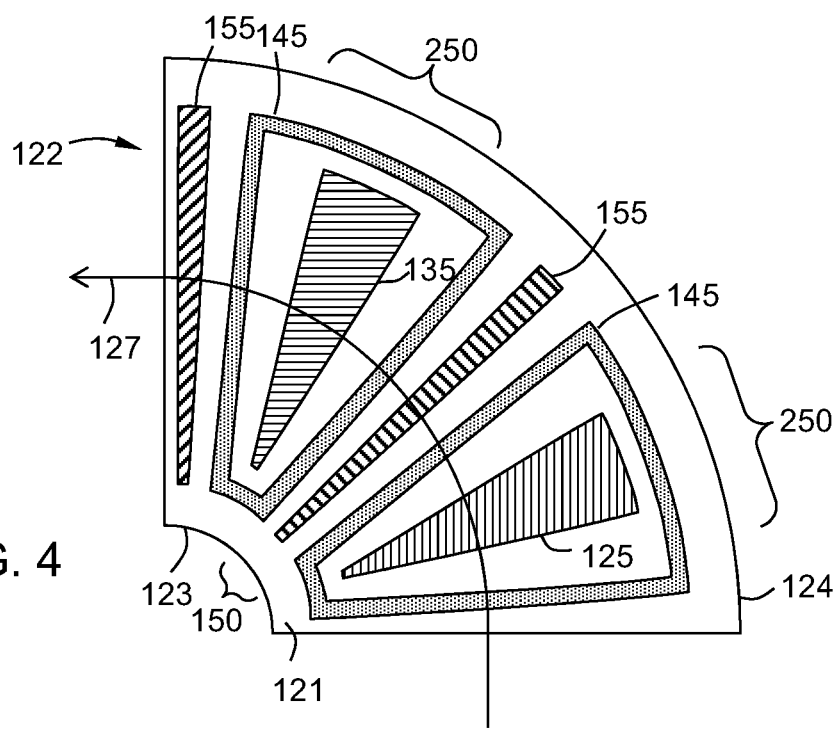
FIG. 4 shows a schematic view of a portion of a wedge shaped gas distribution assembly for use in a batch processing chamber in accordance with one or more embodiment of the disclosure.
Figure 5:
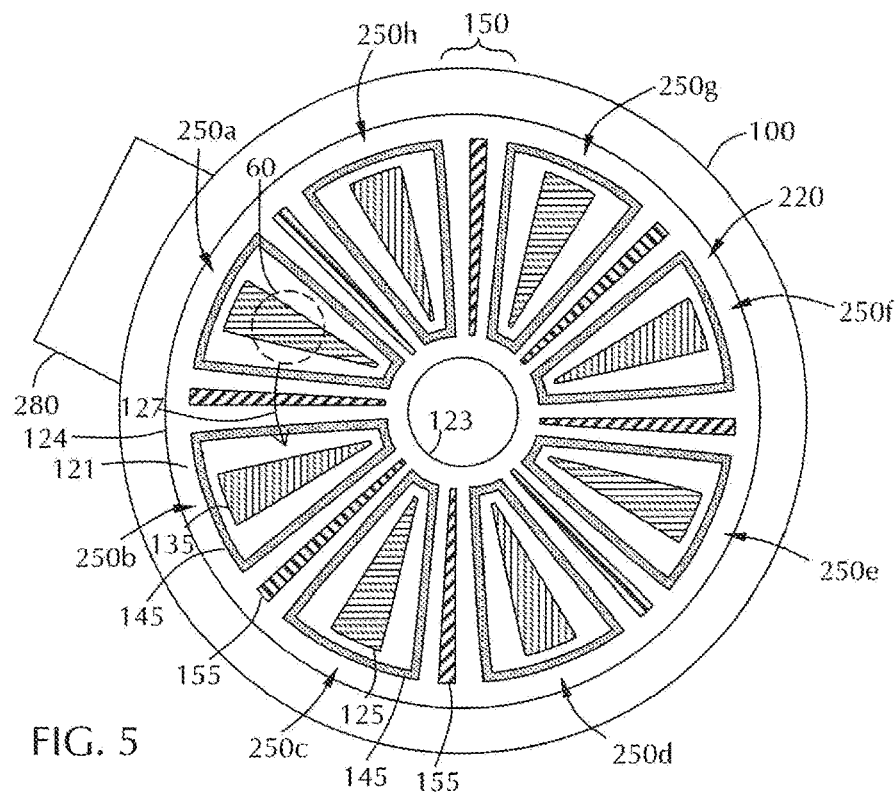
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions. For example, if region 250*a* had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250*b* through processing region 250*h*, an inert gas would be flowing into processing region 250*a*. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

One or more embodiments of the disclosure are directed to hardware gas injector modules that provide multiple gas inlets and multiple gas removal sections within a single module. The number of gas inlets and gas removal sections can be any combination. Some embodiments advantageously provide gas injector inserts that can be retrofit into existing gas distribution assemblies. One or more embodiments advantageously provide injector inserts that allow local gas exchanges and local high and low pressure regions within the modular injector segment.

One or more embodiments of the disclosure are directed to injector modules or inserts that improve the removal of reaction by-product. One or more embodiments of the disclosure provide injector modules that minimize or eliminate parasitic CVD that contributes to process non-uniformity and lack of conformality. Some embodiments of the disclosure provide modules that remove byproducts, target desorption of gas trapping, improve deposition uniformity, improve conformality in higher aspect ratio features, reduce in-film contaminates and/or reduce particles.

One or more embodiments of the disclosure provide pump-purge sources (also referred to as segments and pie-shaped or wedge-shaped inserts) that provide additional high velocity purge gas on top of the wafer as the wafer passes the segment. The high velocity purge gas advantageously washes unused precursor and reaction products/by-products from the substrate surface and process region of the processing chamber. In some embodiments, the pump-purge segment has four high velocity delivery slots with a row of small ports each having super-sonic delivery gas jets that act like an air knife. Vacuum channels are positioned on the sides of the slots to exhaust gas and unwanted constituents. In some embodiments, the pump-purge source is modified to provide a high velocity precursor flow.

One or more embodiments of the disclosure advantageously provide gas delivery systems that deliver and remove chemicals to/from all parts of deeps structures on wafers with high surface area ratios compared to blanket wafers. Some embodiments advantageously provide rapid replenishment of precursor concentration on top of the wafers to as to avoid loading issues which are seen with high surface area wafers.

The use of showerheads and injectors typically result in low velocity of either gas on the surface and the boundary layer has to be broken by either spinning the wafer or moving the wafer at very high velocities within the chamber, resulting in issues with reliability, chemical separation and mean wafer between cleans (MWBC). Some embodiments of the disclosure provide injector segments with about four linear slots providing high velocity gas. The pie assembly of some embodiments comprises three plates clamped together with suitable fasteners. A top plate interfaces with and seals to the Injector cooling plate and interfaces with piping to provide gas and vacuum exhaust. A middle sandwiched plate can have porting for the supply gas and many through holes for vacuum. A bottom plate provides about four angularly equally spaced linear slots for gas delivery to the wafer and three mid-way linear slots for vacuum exhaust. Some embodiments include a precursor delivery bottom plate that does not have any vacuum slots.

Some embodiments of the disclosure provide a module that can be used as an insert for the gas distribution assembly. For example, the injector unit 122 illustrated in FIG. 2 can have the combination of pump and purge channels described and can be installed in the gas distribution assembly to target regions where additional removal or purge or both is positioned. This allows for disruption of the injector symmetry to control the overall process.

Figure 6:
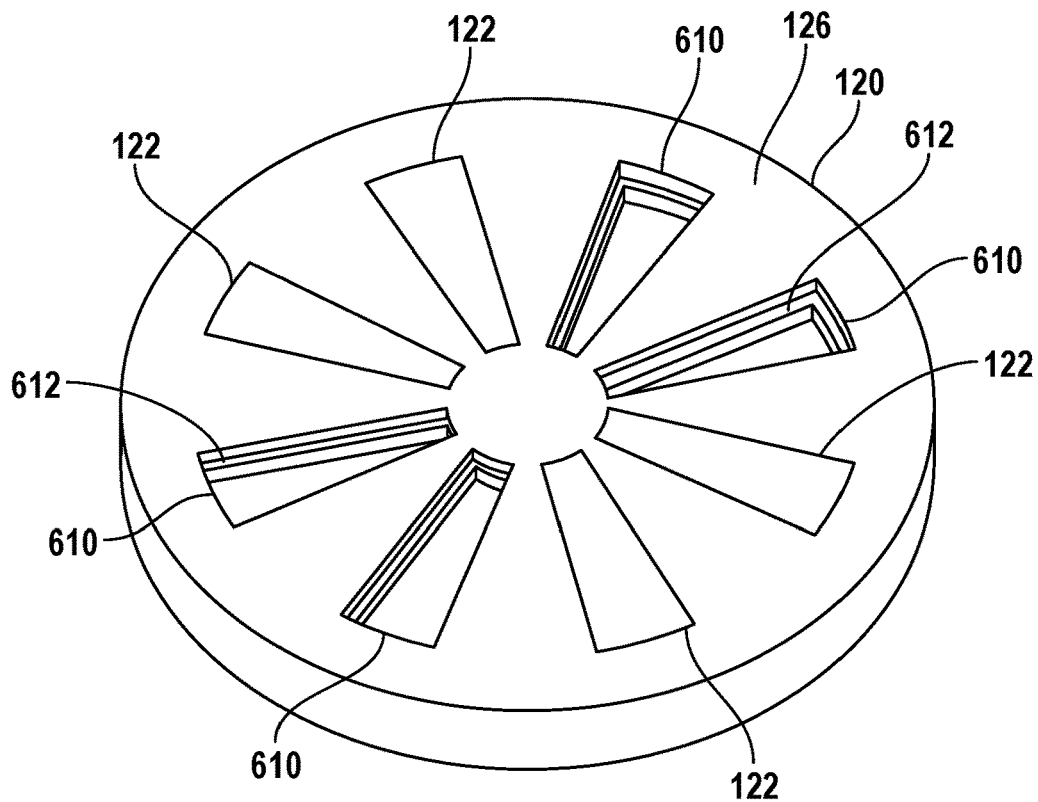
FIG. 6 shows a gas distribution assembly with openings for gas injector inserts in accordance with one or more embodiment of the disclosure.

FIG. 6 illustrates a gas distribution assembly 120 with four injector units 122 and four openings 610. The openings 610 can be occupied by an injector insert (not shown) which will form a uniform component. The openings 610 illustrated include ledges 612 which are sized to support an injector insert.

Figure 7:
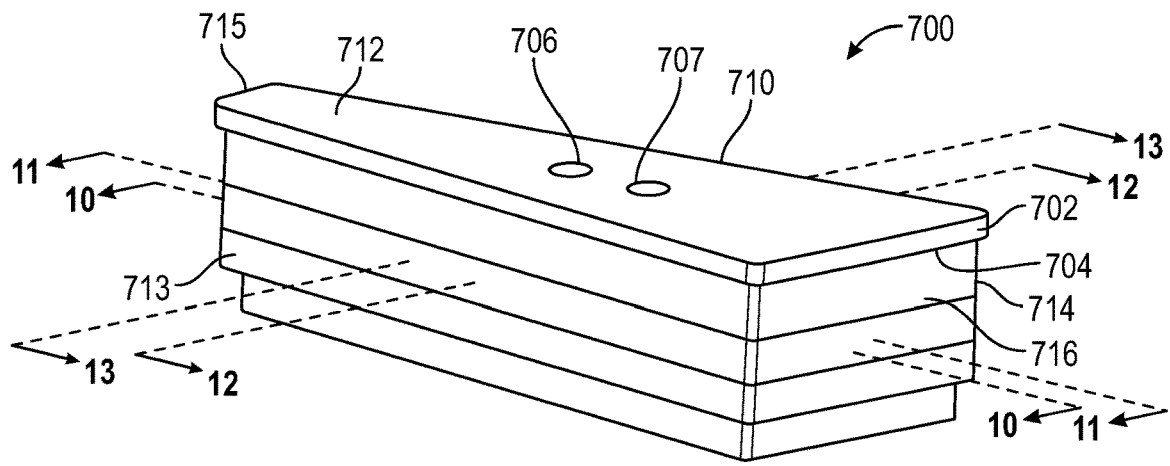
FIG. 7 shows a top perspective view of a gas injector insert in accordance with one or more embodiment of the disclosure.
Figure 8:
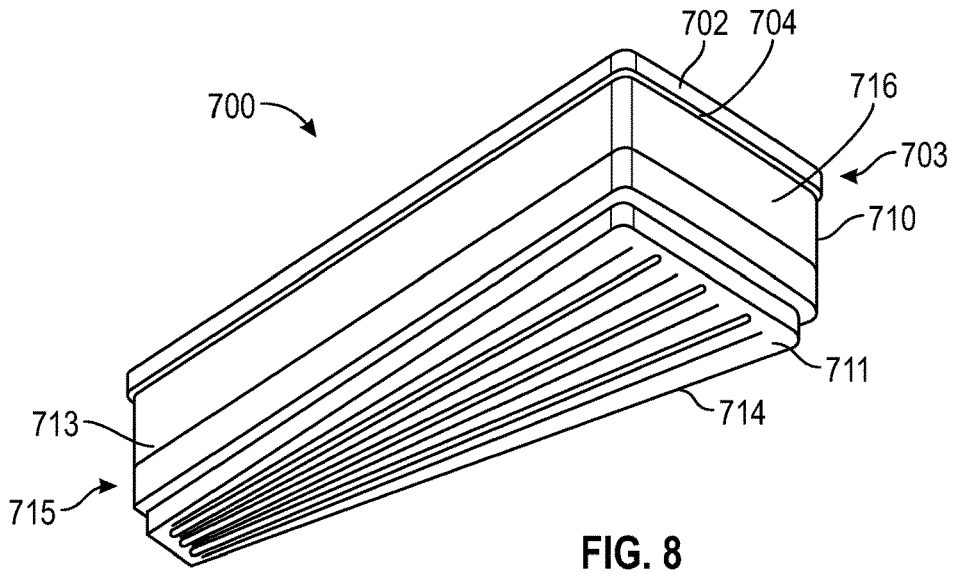
FIG. 8 shows a bottom perspective view of a gas injector insert in accordance with one or more embodiment of the disclosure.
Figure 9:
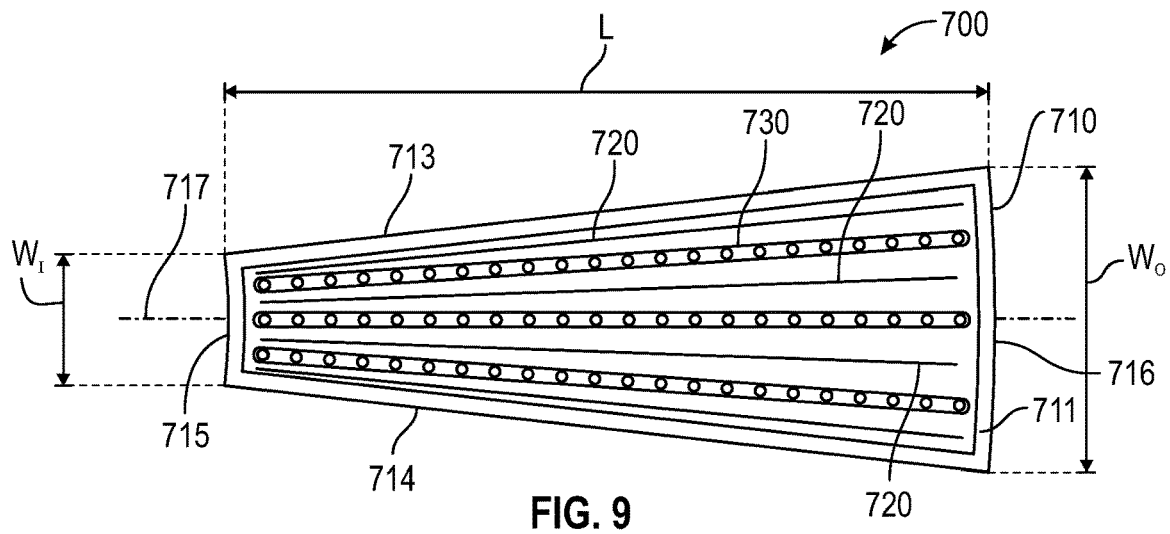
FIG. 9 shows a bottom view of a gas injector insert in accordance with one or more embodiment of the disclosure.

FIGS. 7 and 8 illustrate a gas injector insert 700 in accordance with one more embodiment of the disclosure. FIG. 7 shows a top perspective view of the insert 700 and FIG. 8 shows a bottom perspective view of the insert 700. FIG. 9 shows the front face 711 of the insert 700. The gas injector insert 700 includes a wedge-shaped housing 710 with a back face 712 and a front face 711, an inner peripheral end 715 and an outer peripheral end 716 and a first side 713 and second side 714. The inner peripheral end 715 and outer peripheral end 716 define the length L and an elongate axis 717 that extends along the length L in the middle of the width of the housing 710. The first side 713 and second side 714 define the width of the housing 710. The width increases from the width $W_I$ at the inner peripheral end 715 to the width $W_O$ at the outer peripheral end 716, forming the wedge-shape (also called a pie-shape).

The housing 710 is sized to fit within the opening 610 in the gas distribution plate 120. In some embodiments, as illustrated, the housing 710 includes a top portion 702 and bottom portion 703 configured to form a flange 704. The flange 704 can be a separate component from the injector insert 700 or integrally formed, as illustrated. The injector insert 700 of some embodiments can be lowered into opening 610 (see FIG. 6) so that the flange 704 rests on ledge 612.

In some embodiments, the housing 710 of the gas injector insert 700 is configured so that the front face 711 of the gas injector insert 700 is substantially coplanar with the front face 121 of the gas distribution plate 120 or injector unit 122. As used in this manner, the term "substantially coplanar" means that the front face 711 of the gas injector insert 700 and the front face 121 of the gas distribution plate 120 are coplanar within ±0.2 mm, ±0.15 mm, ±0.10 mm or ±0.05 mm.

Referring back to FIG. 7, the gas injector insert 700 of some embodiments has a first opening 706 and a second opening 707 in the back face 712. The openings 706, 707 can be connected to or configured to be connectable to one or more of a gas source and/or a vacuum source (e.g., vacuum pump or foreline). In some embodiments, there are two, three, four or more first openings 706. In some embodiments, there are two, three, four or more second openings 707. The locations of the first openings and second openings can be varied along the length and width of the insert 700.

Figure 10:
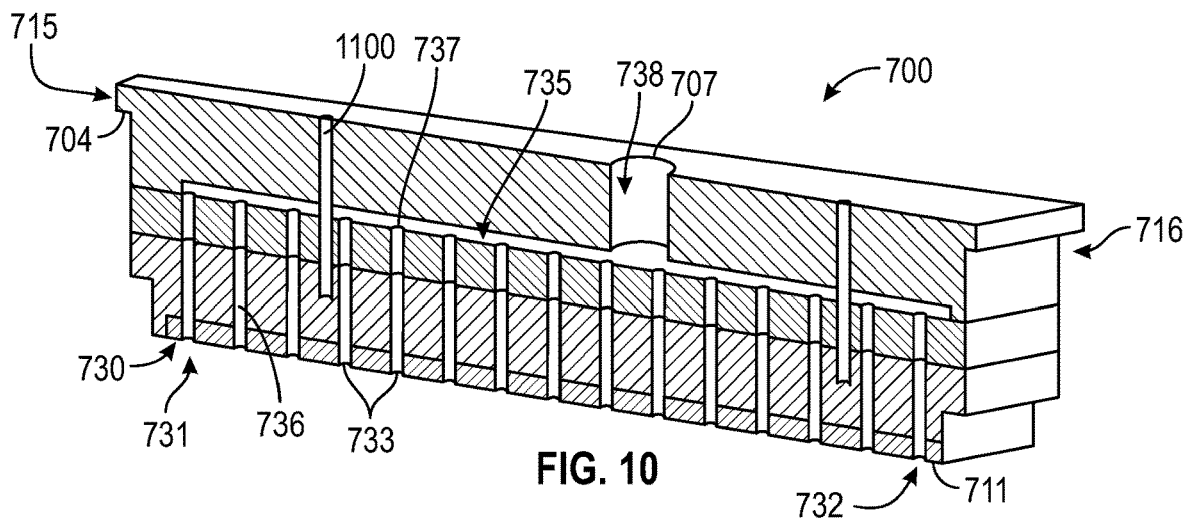
FIG. 10 shows a cross-sectional view of the gas injector insert of FIG. 7 taken along line 10-10.
Figure 13:
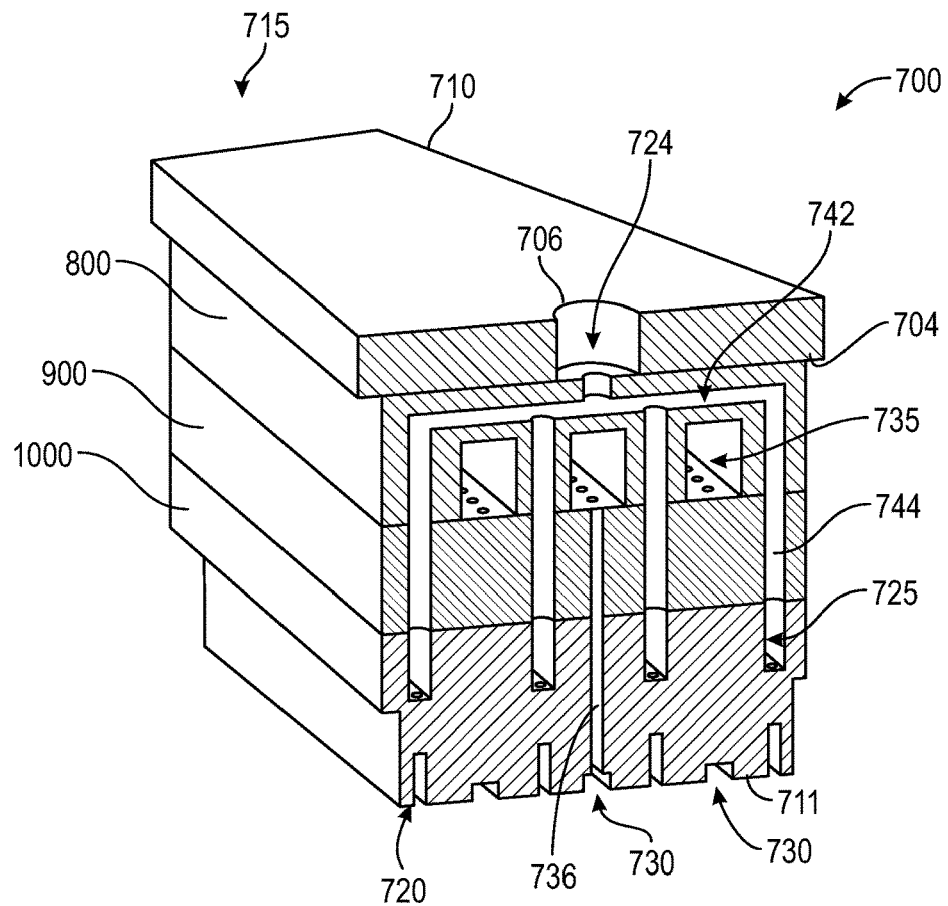
FIG. 13 shows a cross-sectional view of the gas injector insert of FIG. 7 taken along line 13-13.

FIG. 10 shows a cross-sectional view of the gas injector insert 700 of FIG. 7 taken along line 10-10. In the cross-sectional view of FIG. 10, the second opening 707 is bisected and the first opening 706 is not visible. The second opening 707 is in fluid communication with at least one second slot 730 in the front face 711 of the gas injector insert 700. The at least one second slot 730 has an elongate axis that extends from the inner peripheral end 715 to the outer peripheral end 716. It will be understood that any of the slots can extend from a region near the inner peripheral end 715 to a region near the outer peripheral end 716, as shown. The elongate axis extending from the inner peripheral end means that the elongate axis has an inner end 731 near the inner peripheral end 715 and an outer end 732 near the outer peripheral end 716. The second slot 730 illustrated in FIG. 10 is formed as a linear grouping of openings 733 in the front face 711. The term "slot" used in this manner can be a recessed portion with openings within (as shown in FIG. 13), or a line of openings in a flat front face (as shown in FIG. 10).

In some embodiments, the second opening 707 is in fluid communication with at least one plenum 735 through passage 738. The plenum 735 is connected to and in fluid communication with the first slot 730 through passages 736. The passages 736 have plenum openings 737 at one end and first slot 730 at the other end. The volume of the plenum 735 is typically larger than the total volume of the passages 736 so that the flux through the passages 736 at the ends of the plenum is about the same as at the center of the plenum.

Figure 11:
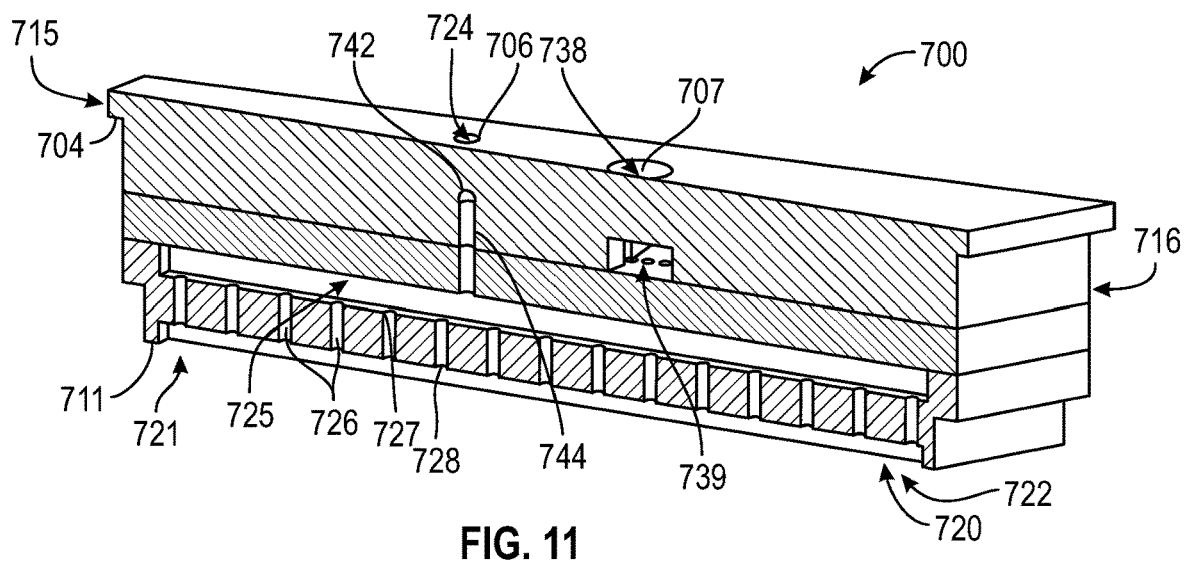
FIG. 11 shows a cross-sectional view of the gas injector insert of FIG. 7 taken along line 11-11.

FIG. 11 shows a cross-sectional view of the gas injector insert 700 of FIG. 7 taken along line 11-11. The first opening 706 is in fluid communication with at least one second slot 720 in the front face 711 of the gas injector insert 700. The at least one second slot 720 has an elongate axis that extends from the inner peripheral end 715 to the outer peripheral end 716 of the housing 710. Stated differently, the elongate axis extends from an inner end 721 near the inner peripheral end 715 and an outer end 722 near the outer peripheral end 716.

In some embodiments, the first opening 706 is in fluid communication with at least one first plenum 725. The first plenum 725 is connected to and in fluid communication with the first slot 720 through passages 726. The volume of the first plenum 725 is typically larger than the total volume of the passages 726 so that the flux through the passages 726 at the ends of the first plenum 725 is about the same as at the center of the first plenum. The first opening 706 of the illustrated embodiment is in fluid communication with the first plenum 725 through passage 724, cross passage 742 and passage 744. The first plenum has passage openings 727 to form fluid communication with the passage 726. The passages 726 have slot openings 728 to form fluid communication from the passages 726 to the slot 720.

FIG. 11 also shows a partial view of a second opening 707 in fluid communication with a second plenum 735 and a cross passage 739. The cross passage 739 provides fluid communication between the adjacent openings that form the second plenum 735.

Figure 12:
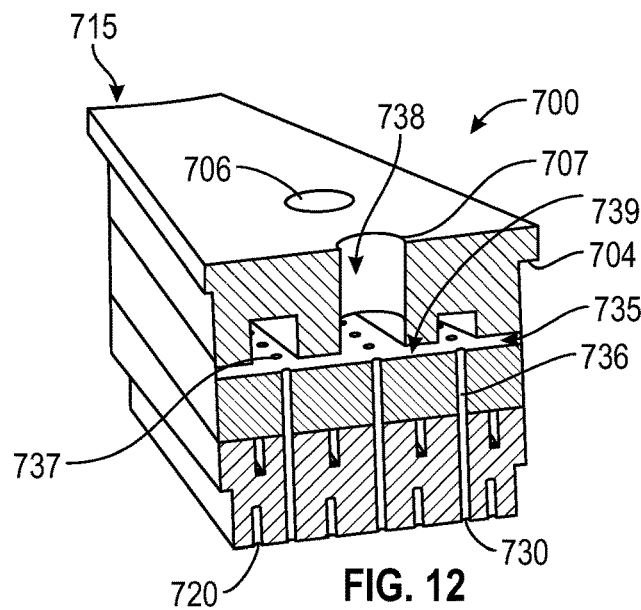
FIG. 12 shows a cross-sectional view of the gas injector insert of FIG. 7 taken along line 12-12.

FIG. 12 shows a cross-sectional view of the gas injector insert 700 of FIG. 7 taken along line 12-12. This view is taken through the second opening 707 and shows passage 738 and cross passage 739 connecting the opening 707 to the second plenum 735.

FIG. 13 shows a cross-sectional view of the gas injector insert 700 of FIG. 7 taken along line 13-13. This view is taken through the first opening 706 and shows the passage 724, cross passage 742 and passage 744 connecting the first opening 706 to the first plenum 725. In this view, the second plenum 735 and passage 736 to the second slot 730 are visible while the second opening 707 is in a different plane. The first slot 720 and second slot 730 illustrated in FIG. 13 shows recessed surfaces with sidewalls extending orthogonal to the surfaces. The slot opening 728 and slot opening 733 are located in the recessed surface of the slots and a gas exiting the slots travels parallel to the sidewalls.

As will be understood by the skilled artisan, the use of the ordinal descriptors for a first slot and second slot, or a first plenum and second plenum, do not imply a particular order of components. Rather, the ordinals illustrate the connected nature of the components. For example, each of the first slots will be connected to a first plenum (either the same plenum or different plenum) and each of the second slots will be connected to a second plenum (either the same plenum or different plenum). A substrate passing the gas injector insert 700 could be first exposed to either the first slot or the second slot and the last exposure could be to either a first slot or a second slot.

The number of first slots 720 and second slots 730 can vary. In some embodiments, there are more first slots 720 than second slots 730. In some embodiments, there are an equal number of first slots 720 and second slots 730. In some embodiments, there are four first slots 720 and three second slots 730, as illustrated in FIGS. 8 and 9.

The shape of the slots can vary. In some embodiments, the first slots 720 are linear slots having a substantially uniform width from the first end 721 to the second end 722 of the first slots 720. In some embodiments, the second slots 730 are linear slots having a substantially uniform width from the first end 731 to the second end 732. In some embodiments, both the first slots 720 and second slots 730 are linear slots. In some embodiments, one or more of the first slots 720 or second slots 730 are wedge-shaped slots. As used in this manner, the term "substantially uniform" means that the width of the slot does not vary by more than 10%, 5%, 2% or 1% at any point along the elongate length relative to the average width.

The order, arrangement and widths of the slots can vary to change the flow dynamics of the process chamber. For example, a combination of vacuum and purge gas slots can create a gas curtain region to remove residual reactive species from the process region. In some embodiments, the injector insert 700 is configured for use as a purge-pump system. In embodiments of this sort, the first slots 720 are in fluid communication with a purge gas through the first opening 706 and the second slots 730 are in fluid communication with a vacuum source through the second opening 707. In some embodiments, each first slot 720 is spaced from an adjacent first slot 720 by a second slot 730.

In some embodiments, each of the first slots 720 extend at an angle to the adjacent first slots 720. The angle between the first slots 720 can vary depending on, for example, the overall size (width and length) of the injector insert 700. In some embodiments, the first slots 720 are at an angle to the adjacent first slots 720 in the range of about 1° to about 10°, or in the range of about 2° to about 8°, or in the range of about 3° to about 6°, or in the range of about 4° to about 5°. In some embodiments, the angle between adjacent first slots 720 is less than or equal to about 15°, 14°, 13°, 12°, 11°, 10°, 9°, 8°, 7°, 6°, 5°, 4°, 3° or 2°.

In some embodiments, the gas injector insert 700 is configured to provide a flow of gas through the housing 710 from the first opening 706 and exiting the first slots 720 at supersonic velocity. In some embodiments, the gas flow exiting the first slots 720 has a velocity greater than or equal to about Mach 1, Mach 1.5, Mach 2, Mach 2.5, Mach 3, Mach 3.5, Mach 4, Mach 4.5 or Mach 5. In some embodiments, the injector insert 700 is configured to provide vacuum streams with subsonic velocities.

In some embodiments, the housing 710 comprises a plurality of components assembled to form the injector insert 700. In some embodiments, as noted in FIG. 13, the wedge-shaped housing 710 comprises a top plate 800, an intermediate plate 900 and a bottom plate 1000.

Figure 14:
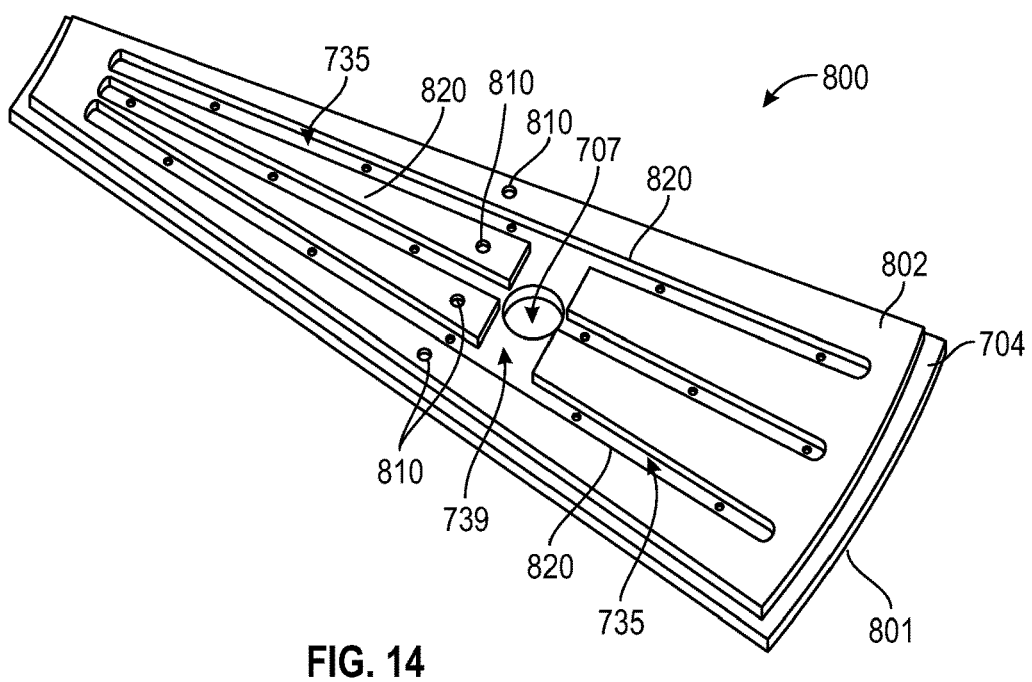
FIG. 14 shows a bottom perspective view of a top plate of a gas injector insert in accordance with one or more embodiment of the disclosure.

FIG. 14 illustrates a top plate 800 in accordance with one or more embodiments of the disclosure. The top plate 800 comprises at least one second opening 707 in the top face 801 that extends through the thickness of the top plate 800. The top face 801 of some embodiments also serves as the back face 712 of the housing 710. In some embodiments, the housing 710 is a separate component that surrounds the top plate 800. The at least one second opening 707 is in fluid communication with a plurality of channels 820 formed in the bottom face 802 of the top plate 800. When the top plate 800 is connected to the intermediate plate 900, the channels 820 in the bottom face 802 of the top plate 800 form the second plenum 730 and cross passage 739.

The top plate 800 also includes at least one first opening 706 which is not visible in the illustrated embodiment. The at least one first opening 706 is in fluid communication with a plurality of passages 810, which are visible, extending through the top plate which will connect with and form fluid communication with the intermediate plate 900.

Figure 15A:
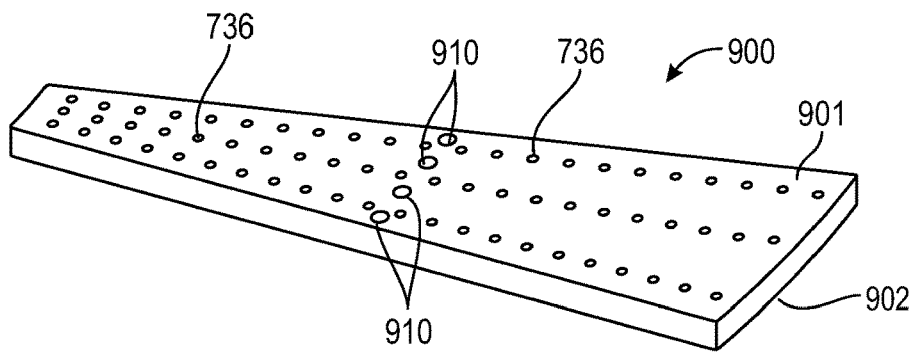
FIG. 15A shows a top perspective view of an intermediate plate of a gas injector insert in accordance with one or more embodiment of the disclosure.
Figure 15B:
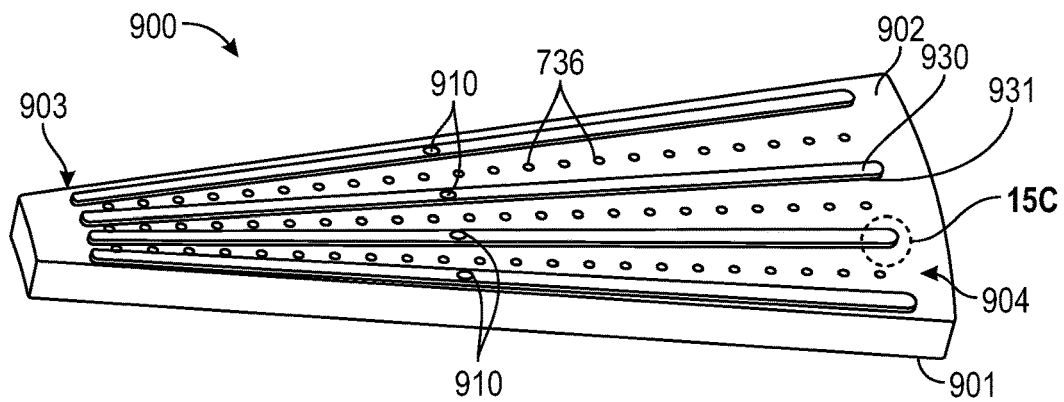
FIG. 15B shows a bottom perspective view of an intermediate plate of a gas injector insert in accordance with one or more embodiment of the disclosure.

FIG. 15A shows a top view of an intermediate plate 900. FIG. 15B shows a bottom view of an intermediate plate 900 in accordance with one or more embodiment of the disclosure. The intermediate plate 900 has a top face 901 and bottom face 902 defining a thickness of the intermediate plate 900. A plurality of first passages 910 extend through the intermediate plate 900 and are aligned with the plurality of passages 810 in the top plate 800. A plurality of second passages 736 extend through the intermediate plate 900 and are aligned with the plurality of channels 820 in the top plate 800.

The bottom face 902 of the illustrated embodiment has a plurality of ridges 930 that extend a distance from the bottom face 902. The ridges 930 extend from an inner end 903 to an outer end 904 of the intermediate plate 900. The ridges 930 of some embodiments, as illustrated, do not extend to the edges of the plate 900. Rather, the inner end 903 is a region near the edge boundary of the plate 900 and the outer end 904 is a region near the edge boundary of the plate 900. Each of the plurality of first passages 910 extend through the intermediate plate 900 to a bottom face 932 of one of the ridges 930.

Figure 15C:
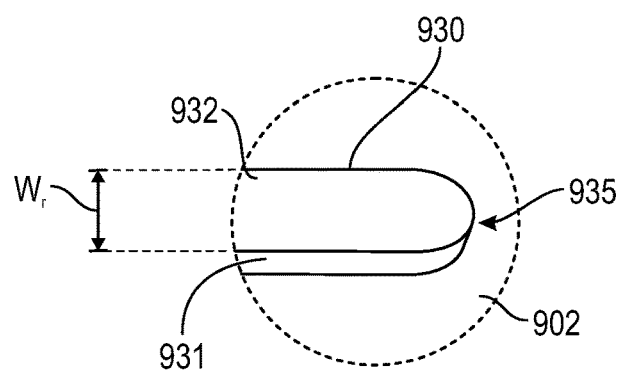
FIG. 15C shows an expanded portion of region 15C from FIG. 15B.

The ridges 930 of some embodiments have sidewalls 931 that extend along a plane orthogonal to the plane formed by the bottom face 902 to a bottom face 932 of the ridge 930. In some embodiments, as shown in expanded view FIG. 15C, the plurality of ridges 930 have sloped sides 931 or ends 935 so that the width $W_r$ of the ridge 930 increases with distance from the bottom face 902 of the intermediate plate 900. In some embodiments, the sloped sides 931 or ends 925 slope so that the width $W_r$ of the ridge 930 decreases with distance from the bottom face 902 of the intermediate plate 900.

Figure 16A:
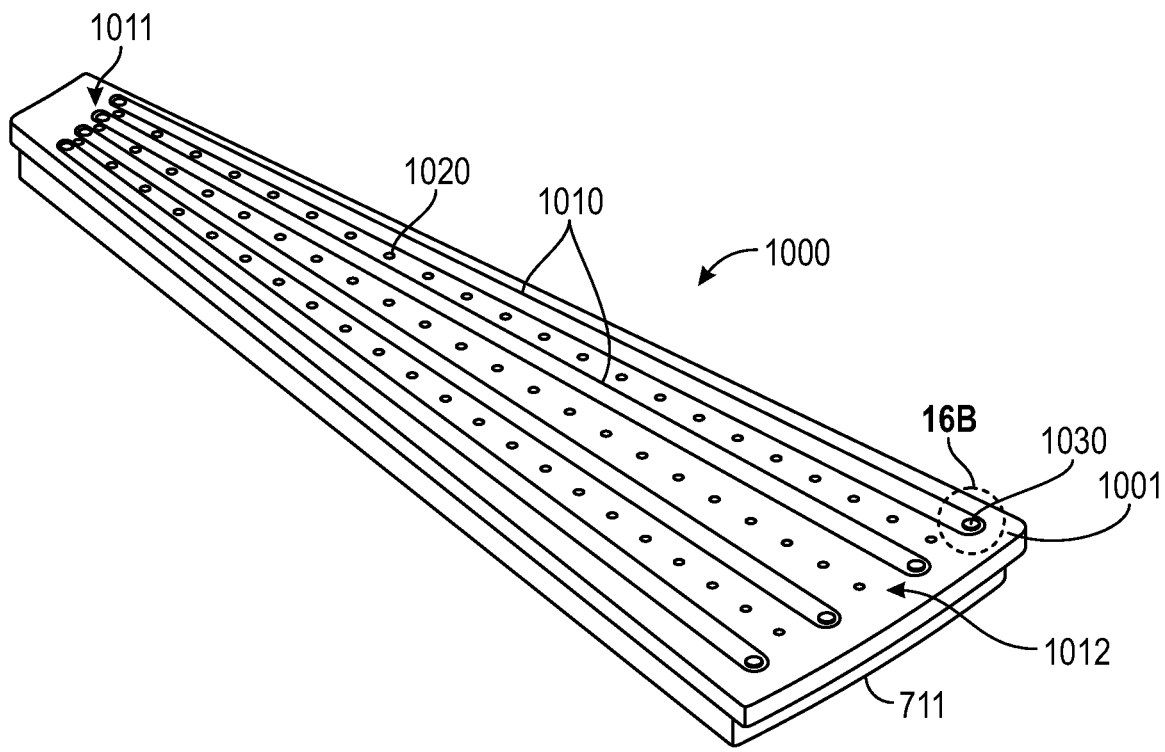
FIG. 16A shows top perspective view of a lower plate of a gas injector insert in accordance with one or more embodiment of the disclosure.

FIG. 16A shows a bottom plate 1000 in accordance with one or more embodiment of the disclosure. The bottom plate 1000 illustrated has a plurality of first channels 1010 and a plurality of second openings 736 in the top face 1001 of the bottom plate 1000. The plurality of first channels 1010 are aligned with the plurality of ridges 930 in the intermediate plate 900 so that when assembled, each ridge 930 is within a channel 1010. The plurality of channels 1010 are in fluid communication with the first slots 720 in the front face of the housing 710. The plurality of second openings 1020 are aligned with the plurality of second passages 736 in the intermediate plate 900 and extend the second passages 736 through the thickness of the bottom plate 1000 to the second slots 730.

Figure 16B:
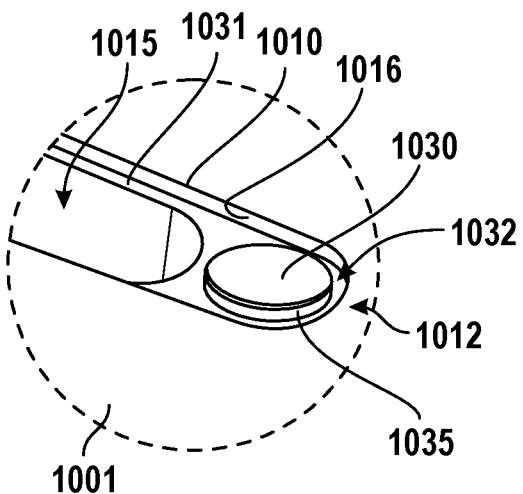
FIG. 16B shows an expanded portion of region 16B from FIG. 16A.

In some embodiments, as shown in expanded view FIG. 16B, each of the plurality of channels 1010 has a post 1030 at a first end 1011 and a second end 1012 of the channel 1010. The post 1030 is adjacent to the ends of the channel with a gap 1032 between the sides 1035 of the post 1030 and the inside face 1016 of the channel 1010. In some embodiments, the sides 1035 of the posts 1030 are sloped so that the width (diameter) of the post 1030 increases with distance from the top face 1031 of the channel 1010. The gap 1032 of some embodiments is sized to support an O-ring (not shown) to help form a gastight seal when the plates are assembled. The channel 1010 includes a recessed portion 1015 which can form the first slots 720 or communicate with additional openings and passages to form fluid communication with the first slots 720.

The top plate 800, intermediate plate 900 and bottom plate 1000 can be assembled to form the injector insert 700. The components can be connected with a fastener 1100 (see FIG. 10) so that the bottom face 802 of the top plate 800 contacts the top face 901 of the intermediate plate 900, and the bottom face 902 of the intermediate plate 900 contacts the top face 1001 of the bottom plate 1000.

Figure 17A:
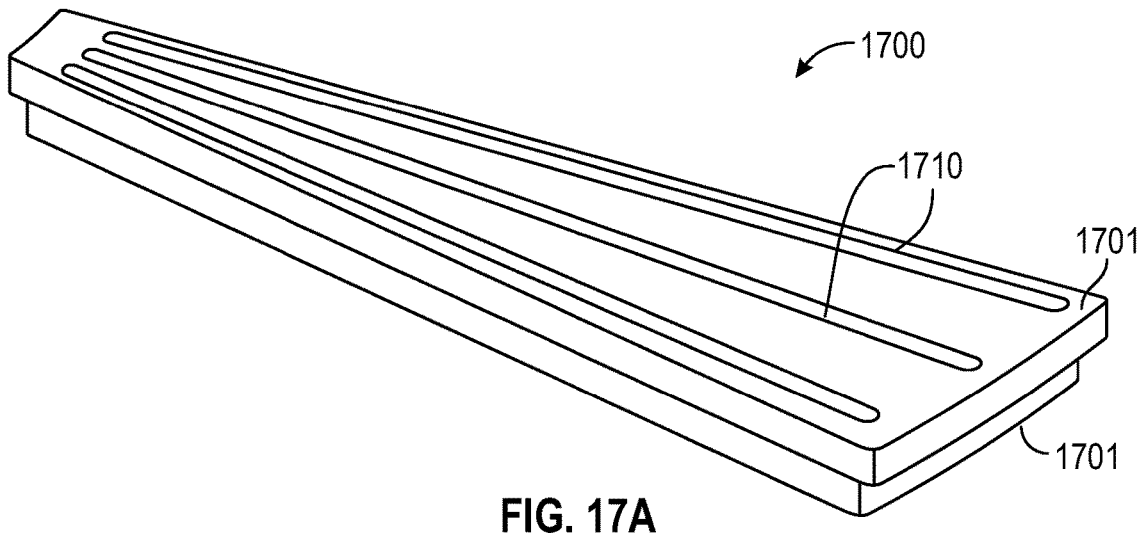
FIGS. 17A and 17B show top and bottom perspective view, respectively, of a lower plate of a gas injector insert in accordance with one or more embodiment of the disclosure.
Figure 17B:
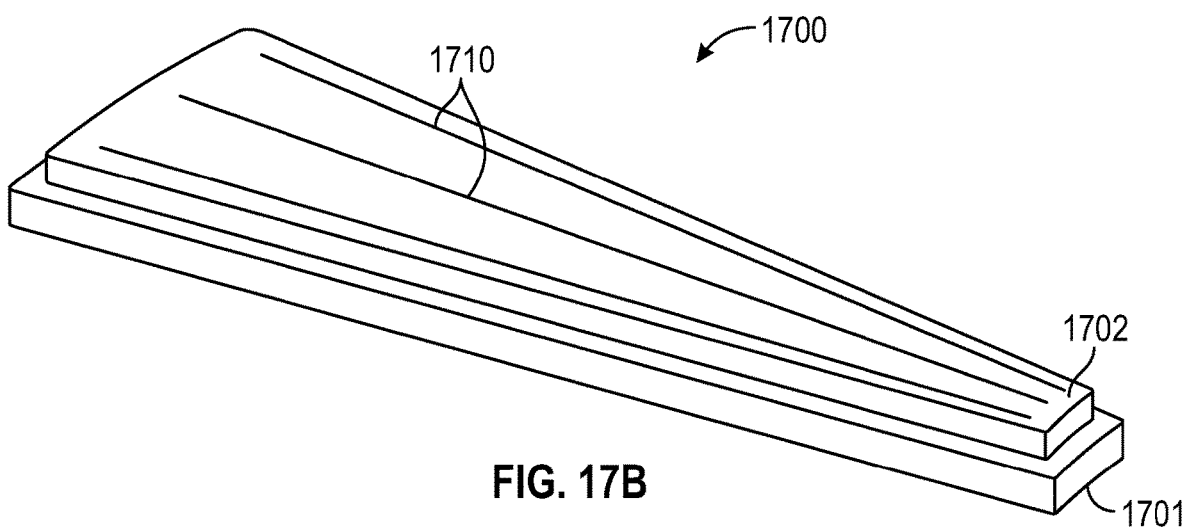

FIG. 17A shows a top view and FIG. 17B shows a bottom view of a bottom plate 1700 for precursor delivery. The embodiment illustrated shows three channels 1710 in the top face 1701 and three slots 1720 in the bottom face 1702 of the bottom plate 1700. The illustrated component can be used with intermediate plates and top plates configured to provide three flow paths. The skilled artisan will recognize that this is merely representative of one possible configuration and should not be taken as limiting the scope of the disclosure. In some embodiments, the precursor delivery bottom plate 1700 has four first slots 1720 and four first channels 1710. In some embodiments, the precursor delivery bottom plate 1700 is configured to provide a flow of precursor or reactive gas at supersonic velocity.

Figure 18A:
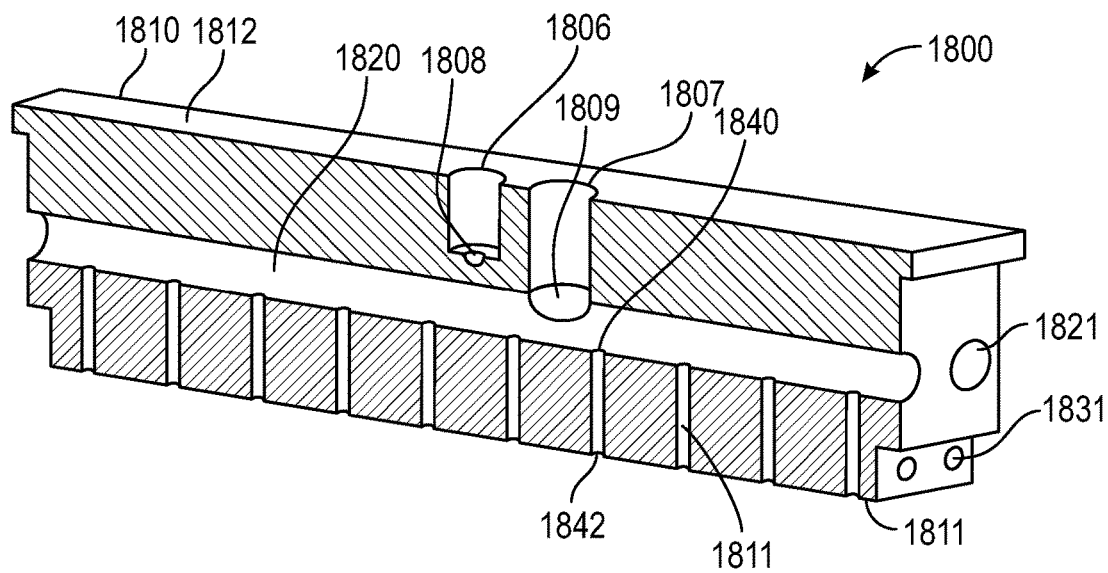
FIGS. 18A and 18B show cross-sectional view of a gas injector insert in accordance with one or more embodiment of the disclosure.
Figure 18B:
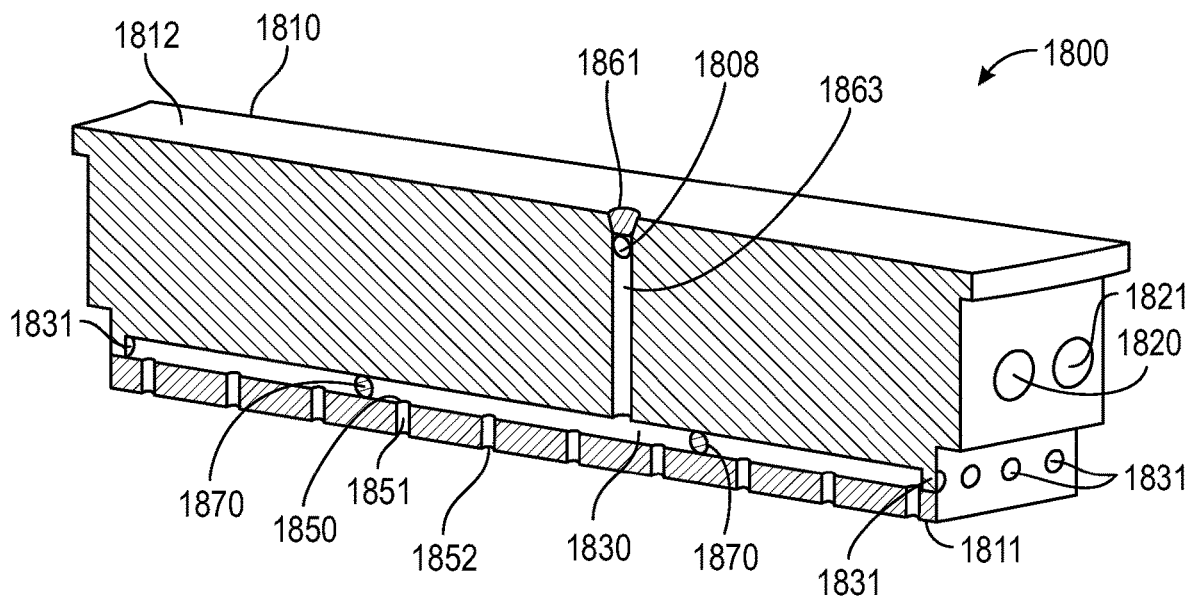

FIGS. 18A and 18B illustrate a gas injector insert 1800 with a single piece body 1810. As used in this manner, the term "single piece" means that the upper plenum and lower plenum are formed in a unitary piece of material. Additional components (e.g., end plugs) can be added. The housing 1810 has a front face 1811 and back face 1812. The housing 1800 can an upper passage 1820 and a lower passage 1830 extending along the elongate axis of the housing 1810. FIG. 18A shows a cross-sectional view of the insert 1800 passing through the upper passage 1820. FIG. 18B is a cross-sectional view of the insert 1800 passing through the lower passages 1830. The upper passage 1820 and lower passage 1830 can act as plenums for the individual gas flow paths.

The upper passage 1820 is in fluid communication with one of the first opening 1806 or second opening 1807 in the back face 1811. The lower passage 1830 is in fluid communication with the other of the first opening 1806 or second opening 1807 in the back face 1811. In the illustrated embodiments, the first opening 1806 is in fluid communication with the lower passage 1830 and the second opening 1807 is in fluid communication with the upper passage 1820.

The upper passage 1820 has a plurality of apertures 1840 in fluid communication with passages 1841 extending from the upper passage 1820 to the opening 1842 in the front face 1811 of the housing 1810. The ends of the upper passage 1820 shown in cross-section are open. Another upper passage 1820 is illustrated within the body of the housing 1810 with plugs 1821 in the ends. The plugs can be inserted after forming the passages to provide a gastight seal. The passage shown in cross-section is in fluid communication with the passage within the body through cross passage 1809 in fluid communication with the upper passages 1820 and second opening 1807. In some embodiments, there are more than one upper passage 1820 connected by upper cross passages 1809.

The lower passage 1830 has a plurality of apertures 1850 in fluid communication with passages 1851 extending from the lower passage 1830 to the opening 1852 in the front face 1811 of the housing 1810. The ends of the lower passage 1830 shows in cross-section are closed with plugs 1831. Two additional lower passages with plugs 1830 are shown in the body the housing 1810. The plugs can be inserted after forming the lower passages 1830 to form a gastight seal.

Passage 1863 is shown extending from the top face 1811 of the housing 1810 to the lower passage 1830. The passage 1863 has a plug 1861 closing off the end at the top face 1811. A cross passage 1808 extends from the first opening 1806 to the passage 1863 and makes fluid connection to the lower passage 1830. A plurality of apertures 1850 in the lower passage 1830 form a fluid connection to the front face 1811 through passage 1851 and opening 1852. In the illustrated embodiment, optional additional cross passages 1870 are shown extending from lower passage 1830 to adjacent lower passages so that there is more than one lower passage connected by the at least one lower cross passage 1870.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A gas injector comprising:
   a top plate having a top face and bottom face defining a thickness of the top plate, an inner peripheral end and an outer peripheral end defining a length and elongate axis, and a first side and a second side defining a width, the width increasing from the inner peripheral end to the outer peripheral end, at least one first opening in the top face is in fluid communication with a plurality of passages extending through the top plate, and at least one second opening in the top face in fluid communication with at least one channel formed in the bottom face of the top plate;
   an intermediate plate having a top face and a bottom face defining a thickness of the intermediate plate, the top face positioned in contact with the bottom face of the top plate, a plurality of first passages extend through the thickness of the intermediate plate and are aligned with the plurality of passages in the top plate, and a plurality of second passages extend through the thickness of the intermediate plate and are aligned with the at least one channel formed in the bottom face of the top plate; and
   a bottom plate having a top face and a bottom face defining a thickness of the bottom plate, the top face of the bottom plate in contact with the bottom face of the intermediate plate, a plurality of first channels in the top face of the bottom plate aligned with the plurality of first passages in the intermediate plate, the plurality of first channels in fluid communication with at least one first slot in the bottom face of the bottom plate, the at least one first slot extending from a first end near an inner peripheral end of the bottom plate to a second end near an outer peripheral end of the bottom plate, and a plurality of second openings in the top face of the bottom plate aligned with the at least one channel in the bottom face of the intermediate plate, the plurality of second openings in fluid communication with at least one second slot formed in the bottom face of the bottom plate, the at least one second slot extending from the first end to the second end of the bottom plate.

2. The gas injector of claim 1, wherein each of the first slots is spaced from adjacent first slots by a second slot and a gas flowing through the first slot exits the first slot at supersonic velocity.

3. The gas injector of claim 2, wherein there are more first slots than second slots.

4. The gas injector of claim 3, wherein there are four first slots and three second slots.

5. The gas injector of claim 4, wherein the first slots are linear slots having a substantially uniform width from the first end to the second end.

6. The gas injector of claim 5, wherein the second slots are linear slots having a substantially uniform width from the first end to the second end.

7. The gas injector of claim 1, wherein the gas injector is configured to provide a flow of gas from the first opening and exiting the first slots at supersonic velocity.

8. The gas injector of claim 7, wherein the first slots are in fluid communication with a purge gas and the second slots are in fluid communication with a vacuum source.

9. The gas injector of claim 1, wherein the bottom face of the intermediate plate comprises a plurality of ridges extending from an inner end to an outer end, each of the plurality of first passages extending to a bottom face of one of the ridges.

10. The gas injector of claim 9, wherein the plurality of ridges have sloped sides so a width of the ridges increases with distance from the bottom face of the intermediate plate.

11. The gas injector of claim 10, wherein the bottom plate has a first plurality of channels and a plurality of second openings in a top face of the bottom plate, the first plurality of channels aligned with the plurality of ridges in the intermediate plate so that when assembled, each of the ridges is within a channel, the plurality of channels in fluid communication with the first slots in the bottom face of the bottom plate, the plurality of second openings aligned with the plurality of second passages in the intermediate plate and extending through a thickness of the bottom plate to second slots in the bottom face of the bottom plate.

12. The gas injector of claim 11, wherein each of the plurality of channels in the bottom plate have a post adjacent a first end and a second end of the channels.

13. The gas injector of claim 1, wherein the top plate, intermediate plate and bottom plate are connected by a fastener so that a bottom face of the top plate contacts a top face of the intermediate plate and a bottom face of the intermediate plate contacts a top face of the bottom plate.

14. The gas injector of claim 13, where there is more than one passage extending through the top plate connected by at least one upper cross passage and there is more than one channel formed in the bottom face of the top plate connected by at least one lower cross passage.

* * * * *